United States Patent
Chen et al.

(10) Patent No.: US 10,192,747 B2
(45) Date of Patent: Jan. 29, 2019

(54) MULTI-LAYER INTER-GATE DIELECTRIC STRUCTURE AND METHOD OF MANUFACTURING THEREOF

(71) Applicant: Cypress Semiconductor Corporation, San Jose, CA (US)

(72) Inventors: Chun Chen, San Jose, CA (US); Shenqing Fang, Fremont, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 15/606,255

(22) Filed: May 26, 2017

(65) Prior Publication Data

US 2017/0263459 A1    Sep. 14, 2017

Related U.S. Application Data

(63) Continuation-in-part of application No. 14/149,628, filed on Jan. 7, 2014, now abandoned.

(51) Int. Cl.
*H01L 21/28* (2006.01)
*H01L 29/423* (2006.01)
*H01L 29/66* (2006.01)
*H01L 29/792* (2006.01)

(52) U.S. Cl.
CPC .. *H01L 21/28282* (2013.01); *H01L 29/42344* (2013.01); *H01L 29/66833* (2013.01); *H01L 29/792* (2013.01)

(58) Field of Classification Search
CPC .................................................. H01L 21/28273

USPC .......................................................... 257/326
See application file for complete search history.

(56) References Cited

U.S. PATENT DOCUMENTS

| 5,953,611 A | 9/1999 | Tanaka |
| 6,133,098 A | 10/2000 | Ogura et al. |
| 7,371,631 B2 | 5/2008 | Sakai et al. |
| 7,663,176 B2 | 2/2010 | Sakai et al. |
| 7,863,135 B2 | 1/2011 | Sakai et al. |
| 9,368,606 B2 | 6/2016 | Fang et al. |

(Continued)

OTHER PUBLICATIONS

K.T. Queeney, "In-Situ FTIR Studies of Reactions at the Silicon/Liquid Interface: Wet Chemical Etching of Ultrathin SiO2 on Si(100)", Journal of Physical Chemistry B 2001, vol. 105, pp. 3903-3907. Published online Feb. 7, 2001.

(Continued)

*Primary Examiner* — Igwe U Anya

(57) ABSTRACT

A semiconductor device having a first gate stack on a substrate is disclosed. The first gate stack may include a first gate conductor over a first gate dielectric structure. A dielectric structure can be formed over the first gate stack and the substrate. The dielectric structure layer can include four or more layers of two or more dielectric films disposed in an alternating manner. The dielectric structure can be selectively etched to form an inter-gate dielectric structure. A second gate conductor can be formed over a second gate dielectric structure, adjacent to the integrate dielectric structure. A dielectric layer can be formed over the substrate, the first and second gate conductors, and the inter-gate dielectric structure. The first gate conductor may be used to make a memory gate and the second gate conductor can be used to make a select gate of a split-gate memory cell.

12 Claims, 18 Drawing Sheets

(56) References Cited

U.S. PATENT DOCUMENTS

| | | | |
|---|---|---|---|
| 2004/0256619 A1* | 12/2004 | Nomura | H01L 21/76804 257/66 |
| 2005/0230736 A1* | 10/2005 | Ishimaru | G11C 16/0466 257/314 |
| 2005/0258474 A1* | 11/2005 | Tanaka | G11C 16/0433 257/316 |
| 2006/0221706 A1* | 10/2006 | Ogura | G11C 16/0475 365/185.28 |
| 2008/0035609 A1* | 2/2008 | Kashkoush | H01L 21/31111 216/84 |
| 2008/0073705 A1 | 3/2008 | Hisamoto et al. | |
| 2008/0121975 A1* | 5/2008 | Hsieh | H01L 27/115 257/319 |
| 2008/0248620 A1* | 10/2008 | Liu | H01L 21/28273 438/257 |
| 2008/0296703 A1 | 12/2008 | Kakoschke et al. | |
| 2009/0050956 A1* | 2/2009 | Ishimaru | H01L 27/115 257/324 |
| 2009/0152618 A1 | 6/2009 | Matsuo et al. | |
| 2009/0179256 A1* | 7/2009 | Lin | G11C 16/0475 257/326 |
| 2013/0026552 A1* | 1/2013 | Toh | H01L 21/28273 257/316 |
| 2013/0119451 A1 | 5/2013 | Rogers et al. | |
| 2015/0194537 A1 | 7/2015 | Chen et al. | |

OTHER PUBLICATIONS

Tvachev, Yuri et al., "Floating-Gate Corner-Enhanced Poly-to-Poly Tunneling in Split-Gate Flash Memory Cells," Jan. 2012, IEEE Transactions on Electron Devices, vol. 59, No. 1.

USPTO Advisory Action for U.S. Appl. No. 14/149,628 dated May 4, 2016; 3 pages.

USPTO Final Rejection for U.S. Appl. No. 14/149,628 dated Feb. 19, 2016; 13 pages.

USPTO Final Rejection for U.S. Appl. No. 14/149,628 dated Dec. 27, 2016; 14 pages.

USPTO Non-Final Rejection for U.S. Appl. No. 14/149,628 dated Aug. 26, 2015; 13 pages.

USPTO Non-Final Rejection for U.S. Appl. No. 14/149,628 dated Sep. 7, 2016; 15 pages.

USPTO Restriction Requirement for U.S. Appl. No. 14/149,628 dated Jun. 2, 2015; 7 pages.

* cited by examiner

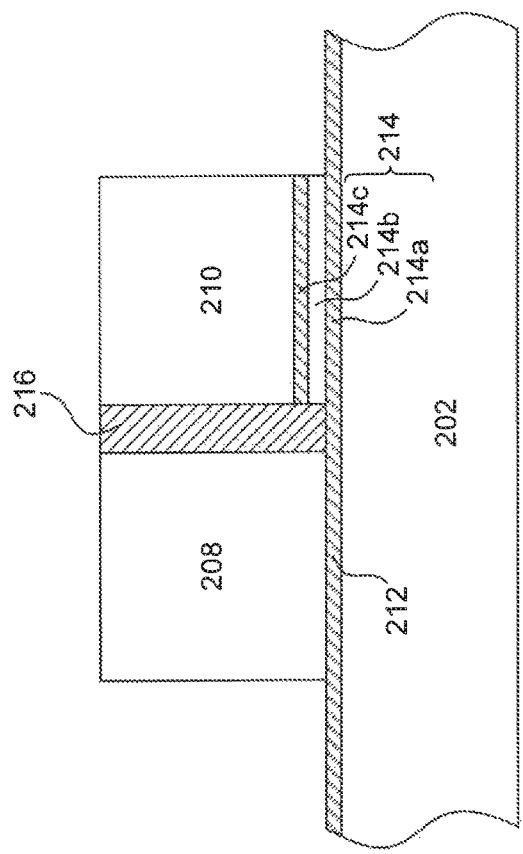

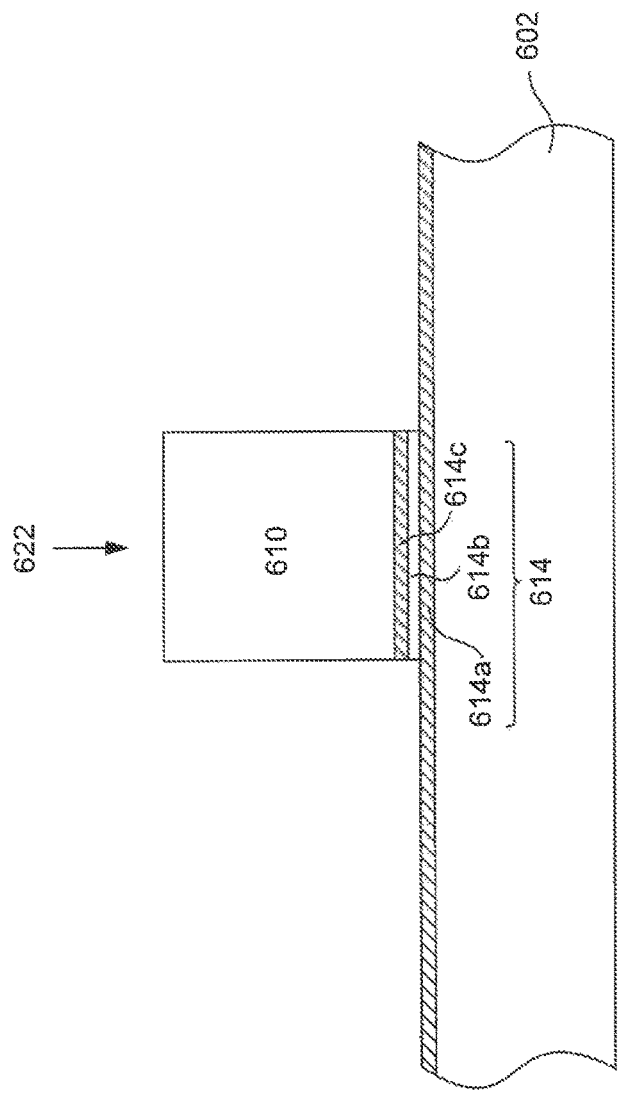

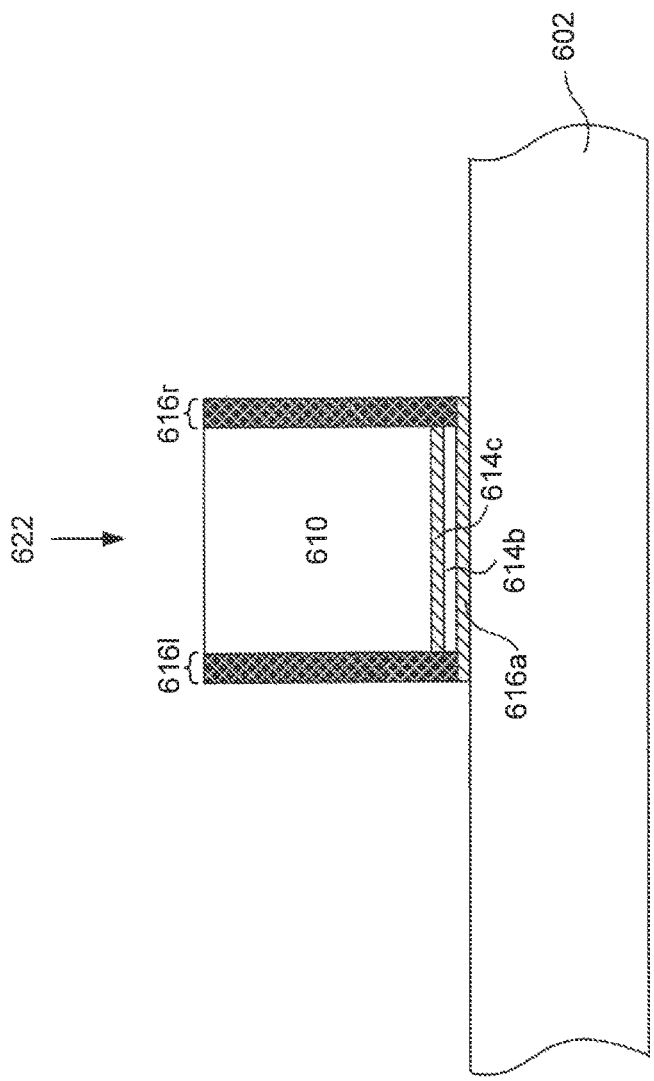

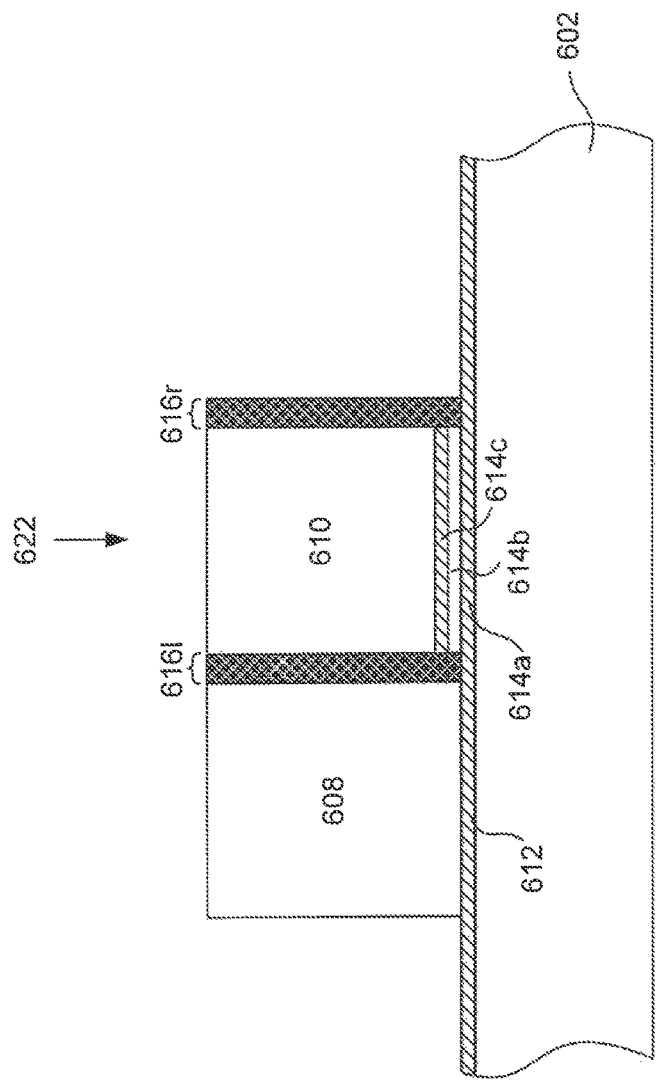

MULTI-LAYER INTER-GATE DIELECTRIC STRUCTURE AND METHOD OF MANUFACTURING THEREOF

PRIORITY

The present application is a Continuation-In-Part Application and claims the priority and benefit of U.S. Non-Provisional application Ser. No. 14/149,628, filed on Jan. 7, 2014, which is incorporated by reference herein in its entirety.

TECHNICAL FIELD

This disclosure relates generally to semiconductor devices and methods for making such devices.

BACKGROUND

Split-gate semiconductor devices typically include a number of gates that are insulated from one another by inter-gate dielectric structures. FIG. 2A illustrates one embodiment of split-gate semiconductor device 200 formed on a substrate 202. Semiconductor device 200 includes a first gate 210 disposed over a gate dielectric structure 214, a second gate 208 disposed over a gate dielectric structure 212, and a single-layer inter-gate dielectric structure 216 disposed between the two gates. The integrate dielectric structure 216 may be made of, but is not limited to, silicon dioxide. FIG. 2B illustrates the same semiconductor device 200 after it has gone through further wet etch or wet clean stages during the fabrication process. In this case, the inter-gate dielectric structure 216 is shown with a portion removed at region 218, creating a gap between gate 208 and gate 210. In subsequent stages of fabrication, this gap may get filled with a lower quality dielectric 220, as shown in FIG. 2C, or undesired chemical residues, or may even form voids. Consequently, the electrical isolation between the two gates may be weakened, leading to excessive leakage current and possibly an early dielectric breakdown between the two gates.

FIGS. 3A-3C illustrate another embodiment of split-gate semiconductor device 300, that is similar to semiconductor device 200 depicted in FIGS. 2A-2C. In one embodiment, the inter-gate dielectric structure 316 may include up to three layers of different dielectric films, such as silicon dioxide/silicon nitride/silicon dioxide. FIG. 3B depicts portions of the inter-gate dielectric structure removed after the semiconductor device depicted in FIG. 3A has gone through further wet etch or wet clean stages during the fabrication process. In FIG. 3B, the dielectric films of the inter-gate dielectric structure are shown to be removed in an uneven manner because etch rates vary based on the wet chemicals used to etch the specific dielectrics. Once again, the gap created between gate 308 and gate 310 may get filled with a lower quality dielectric 320, as shown in FIG. 3C. Undesired chemical residues or even voids may result, weakening the electrical isolation between the two gates. Such undesirable consequences may lead to excessive leakage current and possibly an early dielectric breakdown between the two gates.

What may be needed are split-gate semiconductor devices and methods for manufacturing them that result in inter-gate structures that may not suffer from the above shortcomings.

SUMMARY OF EMBODIMENTS

According to various embodiments, a method of making a semiconductor device and its resulting structure are described. According to the method, a first gate stack may be formed on a substrate. The gate stack may include a first gate conductor over a first gate dielectric structure. A dielectric structure may be formed over the first gate stack and the substrate. The dielectric structure layer may include four or more layers of two or more dielectric films disposed in an alternating manner. The dielectric structure may have a thickness or width of approximately 100-200 Å, and each of the four or more layers may have a width of 30 Å or less. The dielectric structure can be selectively etched to form an inter-gate dielectric structure. A second gate conductor can be formed over a second gate dielectric structure, adjacent to the inter-gate dielectric structure. A dielectric layer can be formed over the substrate, the first and second gate conductors, and the inter-gate dielectric structure.

According to some embodiments, a method of fabricating a semiconductor device includes the steps of forming a first gate stack overlying a substrate, forming a dielectric structure comprising four or more layers encapsulating at least the first gate stack, which further including forming a first layer of a first type of dielectric film, forming a second layer of a second type of dielectric film overlying the first layer, and forming remaining layers of the four or more layers, in which each of the four or more layers includes a width in an approximate range of 0 Å to 30 Å, and the first and second types of dielectric films are arranged in an alternating manner, and the step of removing a portion of the dielectric structure overlying at least a top surface of the first gate stack to form first and second inter-gate dielectric structures respectively on both side surfaces of the first gate stack.

Further features and advantages of embodiments of the subject matter, as well as the structure and operation of various embodiments of the subject matter, are described in detail below with reference to the accompanying drawings. It is noted that the subject matter is not limited to the specific embodiments described herein. Such embodiments are presented herein for illustrative purposes only. Additional embodiments will be apparent to a person skilled in the relevant art(s) based on the teachings contained herein.

BRIEF DESCRIPTION OF THE DRAWINGS

Embodiments of the subject matter will now be described, by way of example only, with reference to the accompanying schematic drawings in which corresponding reference symbols indicate corresponding parts. Further, the accompanying drawings, which are incorporated herein and form part of the specification, illustrate embodiments of the present subject matter, and, together with the description, further serve to explain the principles of the subject matter and to enable a person skilled in the relevant art(s) to make and use the embodiments.

FIGS. 2A-2C depicts a cross-section of a split-gate semiconductor device with a single-layer inter-gate dielectric structure at various points during its manufacture.

FIGS. 6A-6E depict a cross-section of a semiconductor device at various points during its manufacture according to various embodiments.

Figure 1:
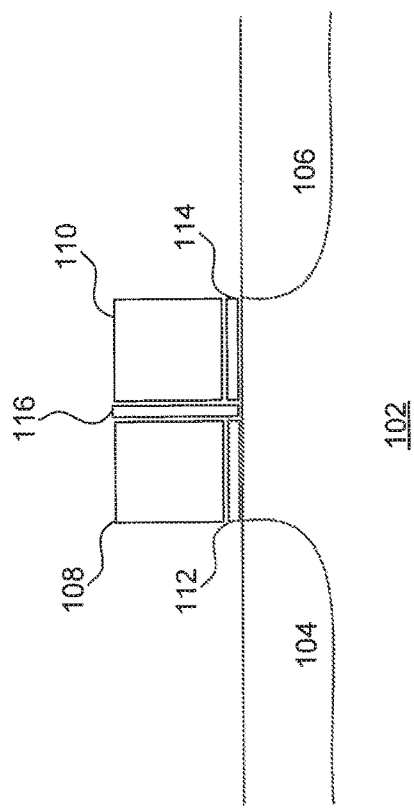
FIG. 1 illustrates an example split-gate non-volatile memory cell according to various embodiments.

The features and advantages of embodiments of the present subject matter will become more apparent from the detailed description set forth below when taken in conjunction with the drawings. In the drawings, like reference numbers generally indicate identical, functionally similar, and/or structurally similar elements.

DETAILED DESCRIPTION

The following description sets forth numerous specific details such as examples of specific systems, components, methods, and so forth, in order to provide a good understanding of several embodiments of the present subject matter. It will be apparent to one skilled in the art, however, that at least some embodiments may be practiced without these specific details. In other instances, well-known components or methods are not described in detail or are presented in a simple block diagram format in order to avoid unnecessarily obscuring the techniques described herein. Thus, the specific details set forth hereinafter are merely exemplary. Particular implementations may vary from these exemplary details and still be contemplated to be within the spirit and scope of the present embodiments.

Embodiments of a memory cell including an embedded non-volatile memory (NVM) transistor and a metal-oxide-semiconductor (MOS) transistor and methods of fabricating the same are described herein with reference to figures. However, particular embodiments may be practiced without one or more of these specific details, or in combination with other known methods, materials, and apparatuses. In the following description, numerous specific details are set forth, such as specific materials, dimensions, concentrations and processes parameters etc. to provide a thorough understanding of the present subject matter. In other instances, well-known semiconductor design and fabrication techniques have not been described in particular detail to avoid unnecessarily obscuring the present subject matter. Reference in the description to "an embodiment", "one embodiment", "an example embodiment", "some embodiments", and "various embodiments" means that a particular feature, structure, or characteristic described in connection with the embodiment(s) is included in at least one embodiment of the subject matter. Further, the appearances of the phrases "an embodiment", "one embodiment", "an example embodiment", "some embodiments", and "various embodiments" in various places in the description do not necessarily all refer to the same embodiment(s).

The description includes references to the accompanying drawings, which form a part of the detailed description. The drawings show illustrations in accordance with exemplary embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

The terms "over", "under", "between", and "on" as used herein refer to a relative position of one layer with respect to other layers. As such, for example, one layer deposited or disposed over or under another layer may be directly in contact with the other layer or may have one or more intervening layers. Moreover, one layer deposited or disposed between layers may be directly in contact with the layers or may have one or more intervening layers. In contrast, a first layer "on" a second layer is in contact with that second layer. Additionally, the relative position of one layer with respect to other layers is provided assuming operations deposit, modify and remove films relative to a starting wafer without consideration of the absolute orientation of the wafer.

Before describing the various embodiments in more detail, further explanation shall be given regarding certain terms that may be used throughout the descriptions.

The term "etch" or "etching" is used herein to generally describe a fabrication process of patterning a material, such that at least a portion of the material remains after the etch is completed. For example, it should be understood that the process of etching silicon involves the steps of patterning a masking layer (e.g., photoresist or a hard mask) above the silicon, and then removing the areas of silicon no longer protected by the masking layer. As such, the areas of silicon protected by the mask would remain behind after the etch process is complete. However, in another example, etching may also refer to a process that does not use a mask, but still leaves behind at least a portion of the material after the etch process is complete.

The above description serves to distinguish the term "etching" from "removing." When etching a material, at least a portion of the material remains behind after the process is completed. In contrast, when removing a material, substantially all of the material is removed in the process. However, in some embodiments, 'removing' is considered to be a broad term that may incorporate etching.

During the descriptions herein, various regions of the substrate upon which the field-effect devices are fabricated are mentioned. It should be understood that these regions may exist anywhere on the substrate and furthermore that the regions may not be mutually exclusive. That is, in some embodiments, portions of one or more regions may overlap. Although up to three different regions are described herein, it should be understood that any number of regions may exist on the substrate and may designate areas having certain types of devices or materials. In general, the regions are used to conveniently describe areas of the substrate that include similar devices and should not limit the scope or spirit of the described embodiments.

The terms "forming," "form," "deposit," or "dispose" are used herein to describe the act of applying a layer of material to the substrate or another layer of material. Such terms are meant to describe any possible layer-forming technique including, but not limited to, thermal growth, sputtering, evaporation, chemical vapor deposition, epitaxial growth, electroplating, etc. According to various embodiments, for instance, deposition. may be performed according to any appropriate well-known method. For instance, deposition can comprise any process that grows, coats, or transfers material onto a substrate. Some well-known technologies include physical vapor deposition (PVD), chemical vapor deposition (CVD), electrochemical deposition (ECD), molecular beam epitaxy (MBE), atomic layer deposition (ALD), and plasma-enhanced CVD (PECVD), amongst others.

The "substrate" as used throughout the descriptions is most commonly thought to be silicon. However, the substrate may also be any of a wide array of semiconductor materials such as germanium, gallium arsenide, indium phosphide, etc. In other embodiments, the substrate may be electrically non-conductive such as a glass or sapphire wafer.

As used herein, "mask" may comprise any appropriate material that allows for selective removal (e.g., etching) of an unmasked portion a material. According to some embodiments, masking structures may comprise a photoresist such as Poly (methyl methacrylate) (PMMA), Poly (methyl glutarimide) (PMGI), a Phenol formaldehyde resin, a suitable epoxy, etc.

Before describing such embodiments in more detail, it is instructive to present an example memory cell and environment in which the present embodiments may be implemented.

FIG. 1 illustrates one embodiment of a split-gate non-volatile memory cell 100. Memory cell 100 is formed on a substrate 102, such as silicon. Substrate 102 is commonly p-type or a p-type well while a first doped source/drain region 104 and a second doped source/drain region 106 are n-type. However, it is also possible for substrate 102 to be n-type while regions 104 and 106 are p-type.

Memory cell 100 includes two gates, a select gate 108, which is formed adjacent to a memory gate 110. Each gate may comprise a gate conductor such as a doped poly layer formed by well-known, for example, deposit and etch techniques to define the gate structure. Select gate 108 is disposed over a dielectric layer 112. Memory gate 110 is disposed over a dielectric 114 having one or more dielectric layers. In one example, dielectric 114 includes a charge-trapping silicon nitride layer sandwiched between two silicon dioxide layers to create a three-layer stack collectively and commonly referred to as "oxide/nitride/oxide" or "ONO." Other dielectrics may include a silicon-rich nitride film, or any film that includes, but is not limited to, silicon, oxygen, and nitrogen in various stoichiometries. An inter-gate dielectric 116 is disposed between select gate 108 and memory gate 110 for electrical isolation between the two gates. In some examples, inter-gate dielectric 116 and dielectric 114 are the same dielectric, while other examples form one dielectric before the other (e.g., they can have different dielectric properties). As such, inter-gate dielectric 116 need not include the same film structure as dielectric 114. Regions 104 and 106 are created by implanting dopants using, for example, an ion implantation technique. Regions 104 and 106 form the source or drain of the split-gate transistor depending on what potentials are applied to each. In split-gate transistors, for convenience, region 104 is commonly referred to as the drain, while region 106 is commonly referred to as the source, independent of the relative biases. It is to be understood that this description is meant to provide a general overview of a common split-gate architecture and that, in actual practice, many more detailed steps and layers are provided to form the final memory cell 100.

Figure 4A:
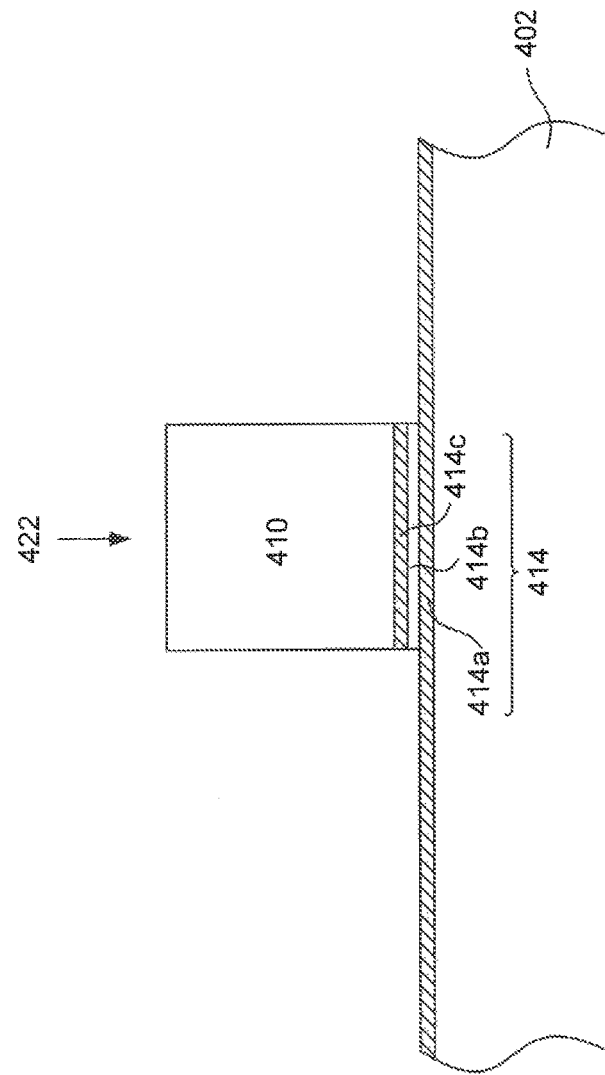
FIGS. 4A-4E depict a cross-section of a semiconductor device at various points during its manufacture according to various embodiments.

The method for manufacturing the improved split-gate semiconductor devices, according to various embodiments, will now be described with respect to FIGS. 4A-4E, which depict a cross-section of a semiconductor device 400 at various stages during its fabrication. In FIG. 4A, semiconductor device 400 is depicted as having a substrate 402. Gate stack 422 has been formed on top of the substrate 402 according to a number of known methods. For instance, U.S. patent application Ser. No. 13/715,577, now issued U.S. Pat. No. 9,368,606, which is hereby incorporated by reference in its entirety, discloses such a method of creating gate stack 422. The present disclosure is not limited to any particular method of producing gate stack 422. Indeed, the spirit and scope of the embodiments of the subject matter includes any appropriate method for forming gate stack 422.

As can be seen in FIG. 4A, gate stack 422 includes a first gate conductor 410. The gate conductor 410 may comprise any suitable material such as polycrystalline silicon ("poly"). A gate dielectric structure 414 has been disposed above the substrate 402 and beneath the gate conductor 410. According to various embodiments, the gate dielectric structure comprises one or more layers of dielectric such as ONO, as described above. For instance, if device 400 will be used as a split-gate memory cell, the gate dielectric structure 414 may comprise a first dielectric layer 414a, a charge-trapping layer 414b, and a second dielectric layer 414c. Regardless of the specific composition of the gate dielectric structure 414, it preferably contains at least one charge-trapping layer 414b. The charge-trapping layer may be formed of a nitride or silicon rich nitride, and may include multiple layers of different nitrides according to some embodiments. Alternatively, the dielectric layer may comprise a single layer of dielectric material such as an oxide, nitride, or some combination thereof.

Figure 4B:
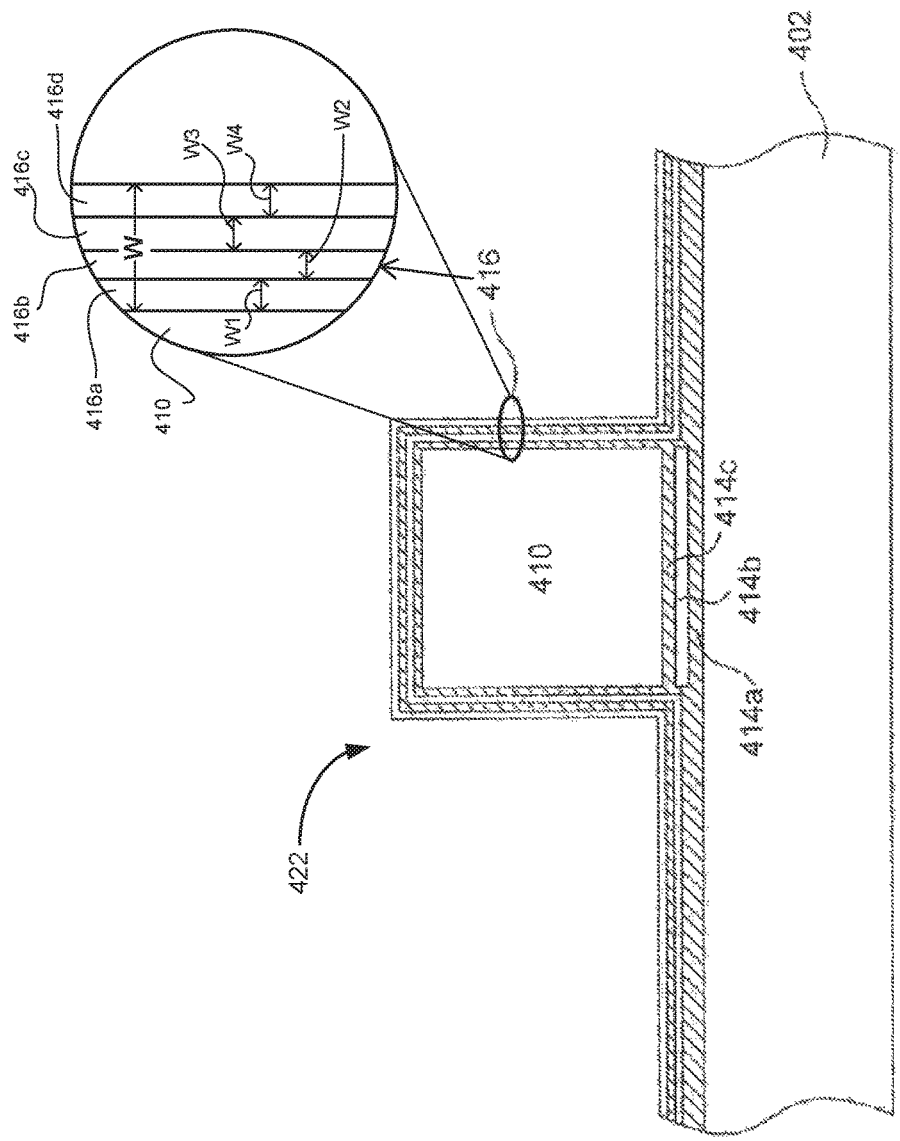

FIG. 4B depicts device 400 at a further point in the production process, where a dielectric structure 416 has been disposed over gate stack 422 and substrate 402 using, for example, in-situ film deposition. In FIG. 4B, the dielectric structure 416 is shown to comprise, but is not limited to, four layers of two different dielectric films disposed in an alternating manner such as "oxide/nitride/oxide/nitride" or "ONON". Each of the different dielectric films of the dielectric structure 416 is formed to have a minimal thickness such that its wet etch rate is significantly less than its bulk etch rate. Additionally, adjacent layers of dielectric films of the dielectric structure 416 are chosen to have significantly different wet etch rates. As best shown in the exploded view of dielectric structure 416 in FIG. 4B, dielectric structure 416 further includes at least four dielectric sub-layers 416a-416d. In one embodiment, dielectric structure 416 may have an operational width W within the approximate range of 100 Å to 200 Å, such that it may provide adequate electrical insulation between (memory) first gate conductor 410 and the subsequently formed (select) second gate conductor 408, as best shown in FIG. 4D. Each of the four dielectric sub-layers 416a-416d may be formed having width W1-W4, respectively. In one embodiment, each of the widths W1-W4 may be controlled within an approximate range of 30 Å or less. As previously discussed, four dielectric sub-layers 416a-416d may include two different types of dielectrics arranged in an alternating manner. As a result, dielectric structure may be a nitride-oxide-nitride-oxide (N—O—N—O) structure, or a O—N—O—N structure. In other embodiments, dielectric structure 416 may include other combinations of dielectric sub-layers, as long as its sub-layers have alternating arrangement and widths W1-W4 are each maintained within the approximate range of 30 Å or less. For example, dielectric sub-layers 416a and 416c may be silicon nitride (hereinafter as "nitride" or "nitride layer"), and dielectric sub-layers 416b and 416d may be silicon oxide (hereinafter as "oxide" or "oxide layer"). In one embodiment, nitride layer may be stoichiometric nitride, non-stoichiometric nitride, or a combination thereof. Alternatively, dielectric sub-layers 416a and 416c may be silicon oxide, and dielectric sub-layers 416b and 416d may be silicon nitride. Silicon nitride and silicon oxide may have significant differences in wet etch rate against one particular etchant. For example, the etch rate of silicon oxide against diluted hydrofluoric acid (DHF) may be significantly higher than silicon nitride. And similarly, the etch rate of silicon nitride against concentrated hot orthophosphoric acid ($H_3PO_4$) may be much higher than silicon oxide. When dielectric sub-layers 416a-416d of two different dielectric types, such as oxide and nitride, are disposed alternatingly and have a relatively small widths W1-W4 in an approximate range of 30 Å or less, it may largely limit the exposure of dielectric sub-layers 416a-416d to any type of etchants. For example, when 416b is oxide, the adjacent nitride layers 416a and 416c may protect 416b from one particular etchant, such as DHF. In other embodiments, when 416b is nitride, the adjacent oxide layers 416a and 416c may protect nitride layer 416b from another etchant, such as $H_3PO_4$. As a result, the combined dielectric structure 416 may be much more resistant (having a very low wet etch rate) against both DHF and $H_3PO_4$, or other etchants.

In one embodiment, alternating oxide-nitride layers of dielectric sub-layers 416a-416d may be formed by subsequently depositing one nitride layer over one oxide layer, or vice versa. In an alternative embodiment, the oxide layers may be formed by oxidizing a portion of the adjacent nitride layer. For example, dielectric sub-layer 416a may be a nitride layer formed by in-situ film deposition, CVD, PVD or other deposition methods. Dielectric sub-layer 416b is formed by oxidizing a top portion of the nitride dielectric sub-layer 416a, using a radical oxidation method, such as in-situ steam generation (ISSG). As a result, the width of dielectric sub-layer 416a is reduced to W1 as a portion its width was converted to the oxide dielectric sub-layer 416b (W2). In one embodiment, there may be an interface layer of silicon oxynitride ($SiO_xN_y$) between the newly formed oxide layer 416b and the nitride layer 416a ($SiO_xN_y$ layer not shown).

Figure 2B:
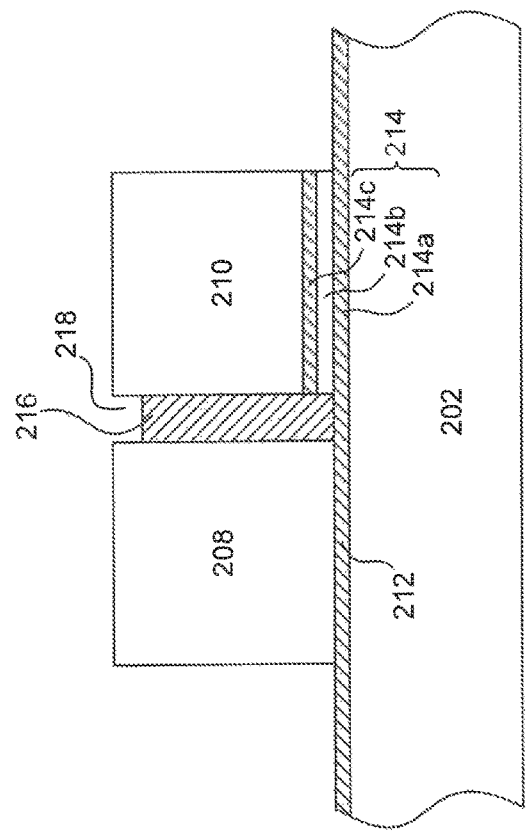
Figure 2C:
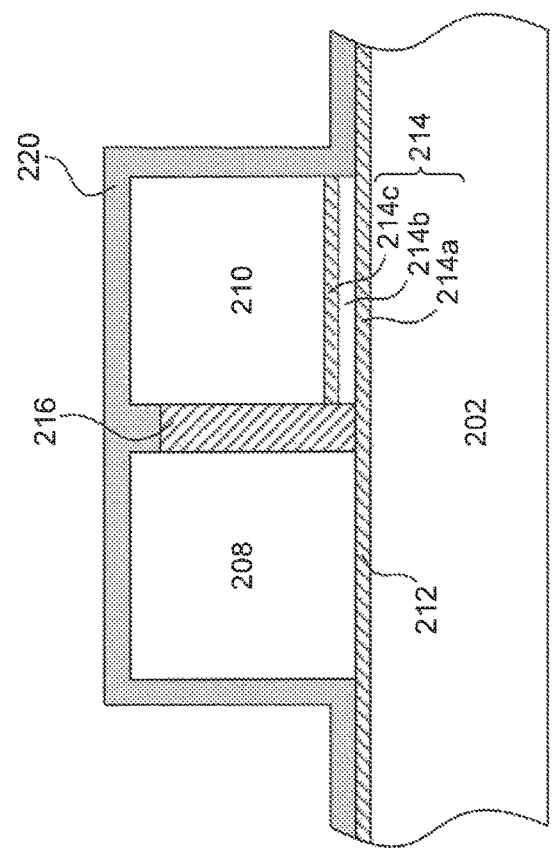
Figure 3A:
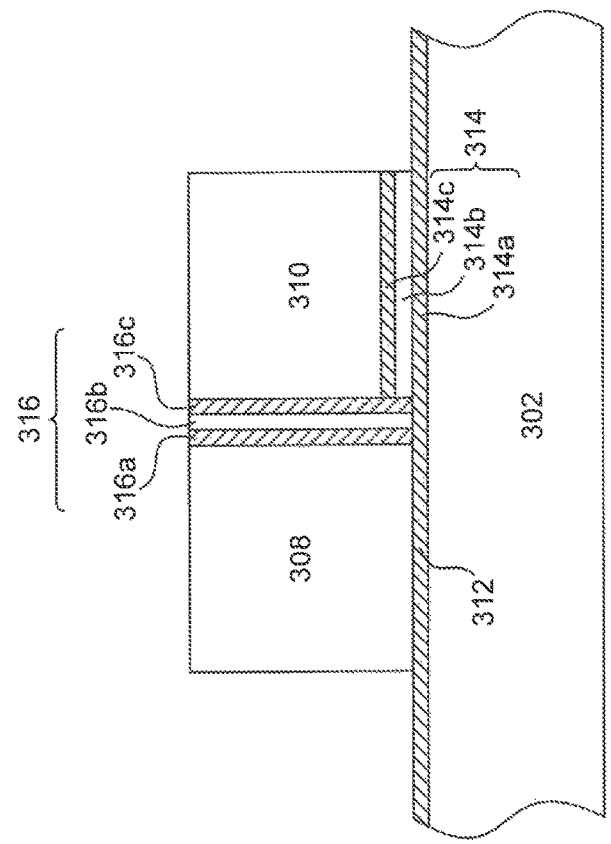
FIGS. 3A-3C depicts a cross-section of a split-gate semiconductor device with a three-layer inter-gate dielectric structure at various points during its manufacture.
Figure 3B:
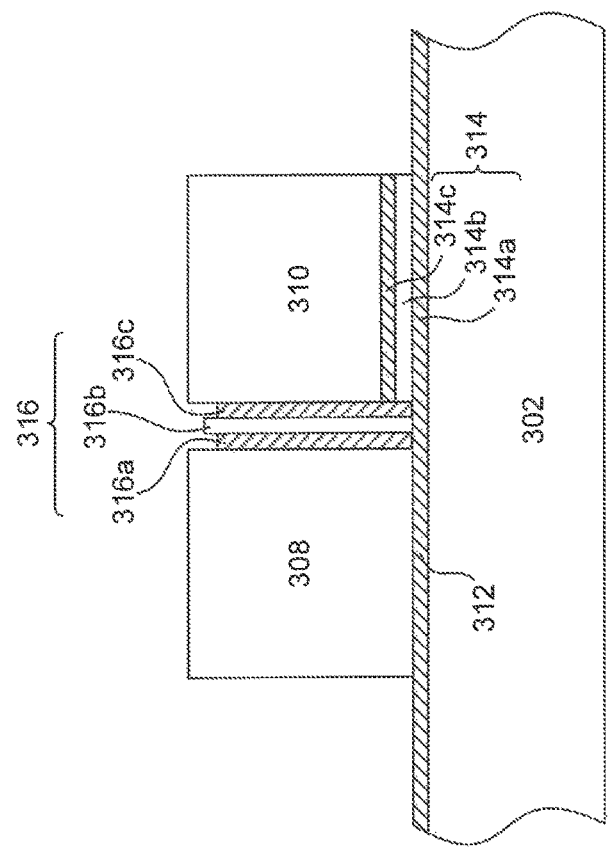
Figure 3C:
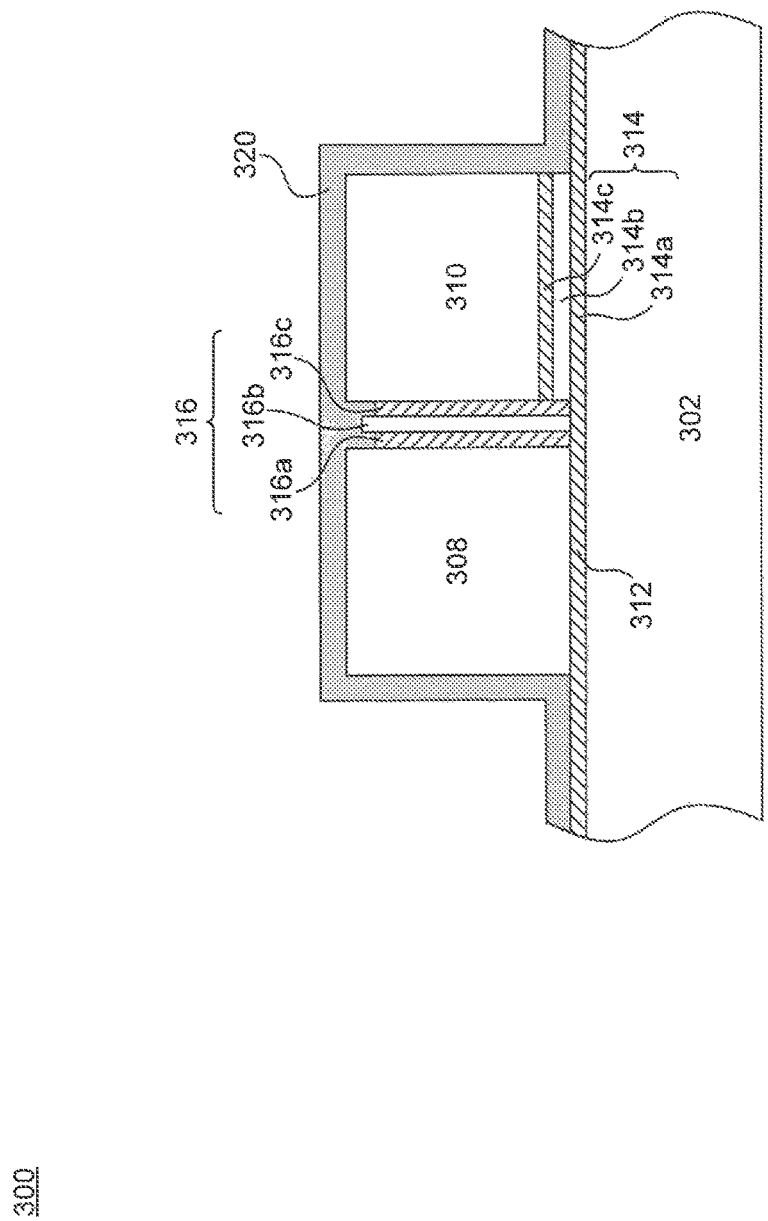
Figure 4C:
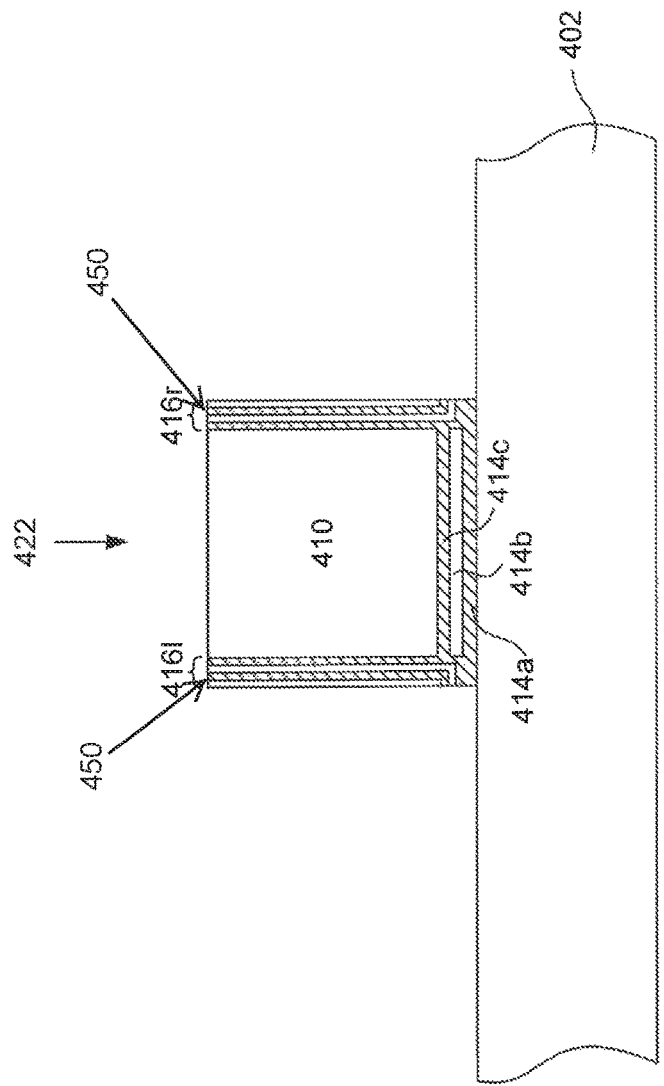
Figure 4D:
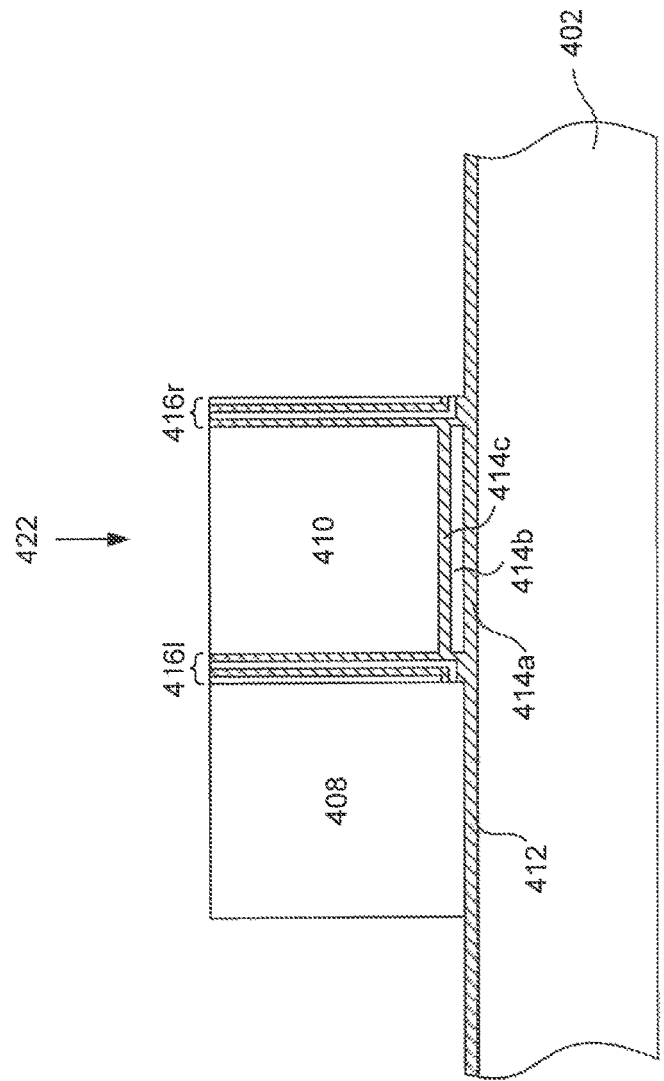

FIG. 4C depicts device 400 after portions of dielectric structure 416 have been selectively removed by, for example, etching, forming dielectric structures 416l (left) and 416r (right) on the sidewalls of first gate conductor 410. More particularly, the portions of dielectric structure overlying top surfaces of first gate conductor 410 and/or substrate 402 may be etched back or removed. In one embodiment, due to the alternating arrangement of two different types of dielectric sub-layers 416a-416d, and the relatively small widths W1-W4 of 30 Å or less, top surfaces 450 of dielectric structures 416l and 416r may not be etched back or removed in an uneven manner, like single-layer inter-gate dielectric structure 216 as best shown in FIG. 2C or inter-gate dielectric structure 316 as best shown in FIG. 3B. FIG. 4D further illustrates a dielectric layer 412 formed on top of the substrate 402 according to a number of known methods. A second gate conductor 408 has also been formed, according to a number of known methods, adjacent to dielectric structure 416l and on top of dielectric 412. Gate conductor 408 may be similarly formed adjacent to dielectric structure 416r. According to various embodiments, first gate conductor 410 may be used to make a memory gate and second gate conductor 408 to make a select gate of a split-gate memory cell. Disposed between the first and second gate conductors, dielectric structure 416l thus forms a four-layer inter-gate dielectric structure.

Figure 4E:
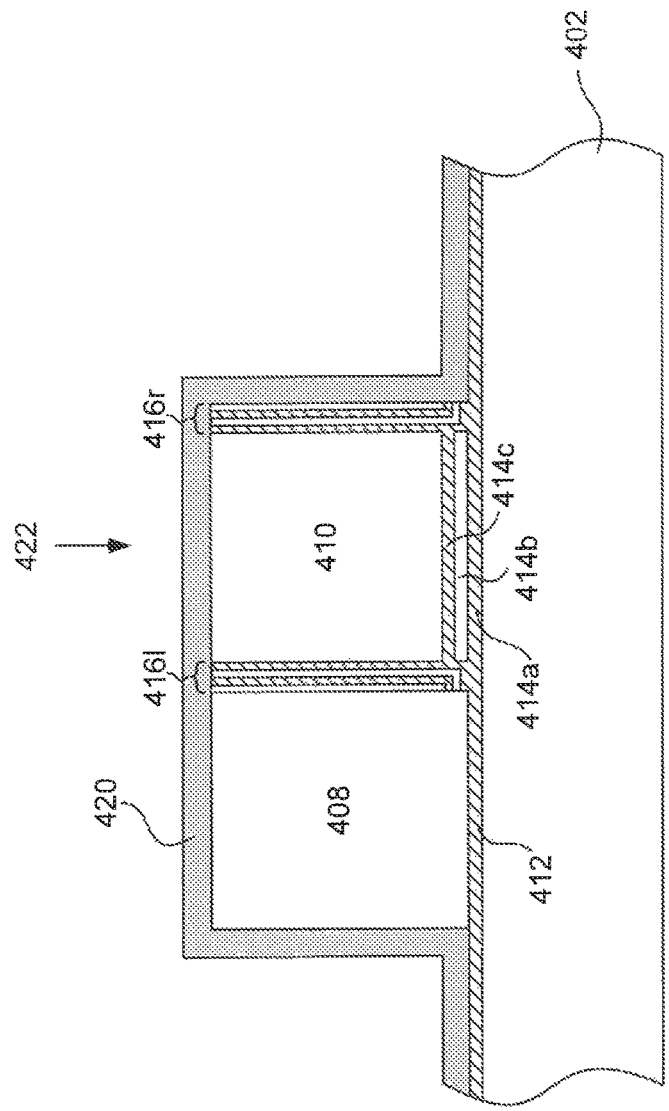

FIG. 4E depicts device 400 at an even further point in the production process, where a dielectric layer 420 is formed over substrate 402, gate conductors 408 and 410, and dielectric structures 416l and 416r. Dielectric layer 420 may be of lower quality than the dielectric films of dielectric structures 416l and 416r. As can be seen in FIG. 4E, the four-layer inter-gate dielectric structure 416l remains resistant to wet etch or wet clean stages prior to dielectric layer 420 being formed. This is attributed to the dielectric films of integrate dielectric structure having a minimal thickness or width W1-W4 in an approximate range of 30 Å or less, such that their wet etch rates are significantly less than their bulk etch rates, and the adjacent dielectric films having significantly different wet etch rates against the same etchants. As a result, the four-layer inter-gate dielectric structure 416 can provide strong electrical isolation and high dielectric breakdown voltage between the two gate conductors, while having stronger resistance to etchants, such as HDF and $H_3PO_4$, or other etchants.

Figure 5:
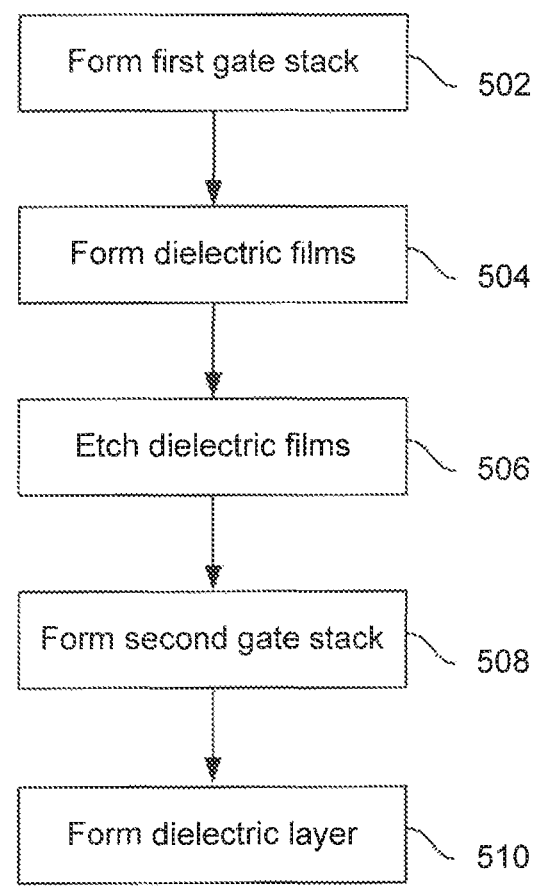
FIG. 5 is a flowchart depicting a method of manufacturing a semiconductor device according to various embodiments.

FIG. 5 depicts a method 500 of constructing a semiconductor device such as device 400 according to various embodiments. The discussion of FIG. 5 will make reference to FIGS. 4A-4E, but it should be understood that method 500 is not limited to the specific embodiments depicted in FIGS. 4A-4E, but is more generally applicable.

As shown in FIG. 5, method 500 begins at step 502 by forming a first gate stack (e.g., gate stack 422) on a substrate 402. Gate stack 422 include a gate conductor 410. Gate stacks 422 also includes a gate dielectric structure 414, which may comprise a first dielectric layer 414a, a charge-trapping layer 414b, and a second dielectric layer 414c. At step 504, dielectric structure 416 is formed over gate stack 422 and substrate 402. Dielectric structure 416 may include four or more layers of two or more different alternating dielectric films. In one embodiment, width of the dielectric structure may be in an approximate range of 100 Å-200 Å and each of the four or more dielectric layers may have a width in an approximate range of 30 Å or less. At step 506, portions of the dielectric structure 416 are selectively removed to form dielectric structures 416l and 416r, either of which may be used as the inter-gate dielectric structure. At step 508, a second gate stack is formed adjacent to either dielectric structure 416l or 416r. The second gate stack include a gate conductor 408, which may be disposed on a gate dielectric structure 412. At step 510, a dielectric layer 420 is formed over substrate 402, gate conductors 408 and 410, and dielectric structures 416l and 416r.

FIGS. 6A-6E depict a cross-section of semiconductor device 600 at various stages during its production according to various embodiments. As will be seen, while device 600 is the same as device 400 in a number of ways, it differs in several other ways.

As can be seen in FIG. 6A, device 600, much like device 400, includes gate stack 622 formed on top of substrate 602 according to a number of known methods. Gate stack 622 includes a first gate conductor 610, which may comprise any suitable material such as poly. A gate dielectric structure 614 has been disposed above the substrate 602 and beneath the gate conductor 610. According to various embodiments, the gate dielectric structure comprises one or more layers of dielectric such as ONO, as described above. For instance, if device 600 will be used as a split-gate memory cell, the gate dielectric structure 614 may comprise a first dielectric layer 614a, a charge-trapping layer 614b, and a second dielectric layer 614c.

Figure 6B:
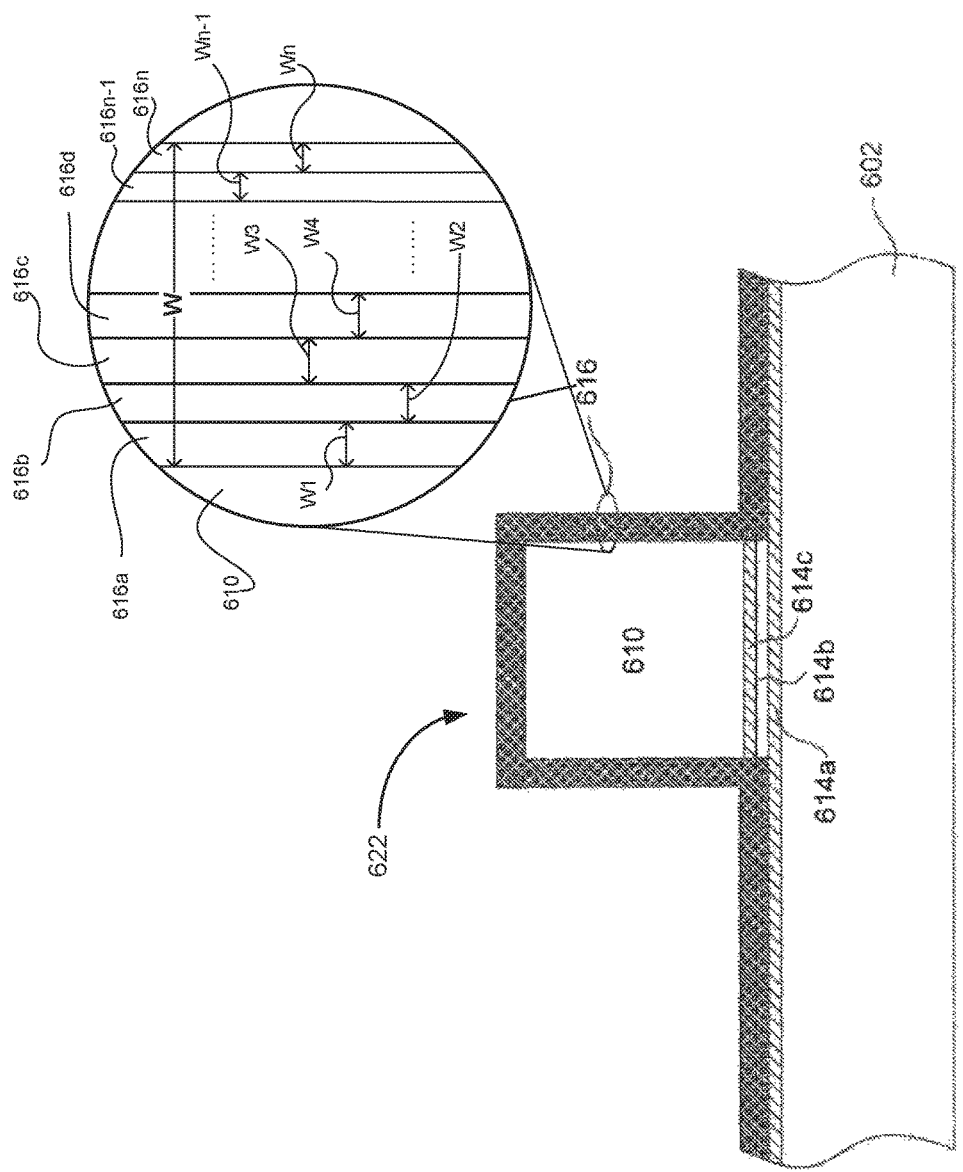

FIG. 6B depicts device 600 at a further point in the production process, where a dielectric structure 616 has been disposed over gate stack 622 and substrate 602 using, for example, in-situ film deposition. Different from device 400, but not explicitly shown in FIG. 6B, the dielectric structure 616 may comprise four or more layers of two or more different dielectric films disposed in an alternating manner. For example, dielectric structure 616 may comprise four alternating oxide and nitride films, i.e. "ONON," or at least one further layer of oxide film, or at least one further alternating pair of oxide/nitride films. Alternatively, dielectric structure 616 may comprise four alternating nitride and oxide films, i.e. "NONO," or at least one further layer of nitride film, or at least one further alternating pair of nitride/oxide films. Similar to device 400, each of the different dielectric films of the dielectric structure 616 is formed to have a minimal thickness such that its wet etch rate is significantly less than its bulk etch rate. Additionally, adjacent layers of dielectric films of the dielectric structure 616 are chosen to have significantly different wet etch rates against the same etchants. As best shown in the exploded view of dielectric structure 616 in FIG. 6B, dielectric structure 616 further includes more than four dielectric sub-layers 416a-416n. In one embodiment, dielectric structure 416 may have an operational width W within the approximate range of 100 Å to 200 Å, such that it may provide adequate electrical insulation between (memory) first gate conductor 610 and the subsequently formed (select) second gate conductor 608, as best shown in FIG. 6D. Each of the dielectric sub-layers 416a-416n may be formed having widths W1-Wn, respectively. In one embodiment, each of the widths W1-Wn may be controlled within an approximate range of 30 Å or less and W1-Wn may be of the same width or different widths. As previously discussed, dielectric sub-layers 416a-416n may include two or more than two different types of dielectrics arranged in an alternating manner. As a result, for examples, dielectric structure 616 may be a nitride-oxide-nitride-oxide (N—O— . . . N—O) structure, or a O—N— . . . O—N structure. In an alternative embodiment, dielectric structure 616 may also include one or more layers of silicon oxynitride (SiON), SiCN, $Al_xO_y$, $Hf_xO_y$, $Hf_xAl_yO_z$, or other dielectric sub-layers. In other embodiments, dielectric structure 616 may include other combinations of dielectric sub-layers, as long as the dielectric sub-layers have the alternating arrangement and widths W1-Wn are each maintained within the approximate range of 30 Å or less. For example, dielectric sub-layers 616a and 616c may be nitride, and dielectric sub-layers 616b and 616d may be oxide. In one embodiment, nitride layer may be stoichiometric nitride, non-stoichiometric nitride, or a combination thereof. Alternatively, dielectric sub-layers 416a and 416c may be silicon oxide, and dielectric sub-layers 616b and 616d may be silicon nitride. Silicon nitride and silicon oxide may have significant differences in wet etch rate against one particular etchant. For example, the etch rate of silicon oxide against diluted hydrofluoric acid (DHF) may be significantly higher than silicon nitride. And similarly, the etch rate of silicon nitride against concentrated hot orthophosphoric acid ($H_3PO_4$) may be much higher than silicon oxide. When dielectric sub-layers 616a-616d of two or more different dielectric types, such as oxide, nitride, oxynitride, and/or other dielectrics are disposed alternatingly and have a relatively small width W1-Wn in an approximate range of 30 Å or less, it may largely limit the exposure of dielectric sub-layers 616a-616n to any type of etchants. For example, when 616b is oxide, the adjacent nitride layers 616a and 616c may protect 616b from one particular etchant, such as DHF. In other embodiments, when 616b is nitride, the adjacent oxide layers 616a and 616c may protect nitride layer 616b from etchant, such as $H_3PO_4$. As a result, the combined dielectric structure 616 may be much more resistant (having a very low wet etch rate) against both DHF and $H_3PO_4$, or other etchants.

In one embodiment, alternating oxide-nitride layers of dielectric sub-layers 616a-616n may be formed by subsequently depositing one nitride layer over one oxide layer, or vice versa. In an alternative embodiment, the oxide layers may be formed by oxidizing a portion of their adjacent nitride layer. For example, dielectric sub-layer 616a may be a nitride layer formed by in-situ film deposition, CVD, PVD or other deposition methods. Dielectric sub-layer 616b is formed by oxidizing a top portion of the nitride dielectric sub-layer 616a, using a radical oxidation method, such as in-situ steam generation (ISSG). As a result, the width of dielectric sub-layer 616a is reduced to W1 as a portion its width was converted to the oxide dielectric sub-layer 616b (W2). In one embodiment, there may be an interface layer of silicon oxynitride ($SiO_xN_y$) between the newly formed oxide layer 616b and the nitride layer 616a ($SiO_xN_y$ layer not shown).

FIG. 6C depicts device 600 after portions of dielectric structure 616 have been selectively removed by, for example, etching, forming dielectric structures 616l and 616r on the sidewalls of first gate conductor 610. More particularly, the portions of dielectric structure overlying top surfaces of first gate conductor 610 and/or substrate 602 may be etched back or removed. In one embodiment, due to the alternating arrangement of two or more different types of dielectric sub-layers 616a-616n, and the relatively small widths W1-Wn, top surfaces 650 of dielectric structures 416l and 416r may not be etched back or removed in an uneven manner, like single-layer inter-gate dielectric structure 216 as best shown in FIG. 2C or inter-gate dielectric structure 316 as best shown in FIG. 3B. FIG. 6D further illustrates a dielectric layer 612 formed on top of the substrate 602 according to a number of known methods. A second gate conductor 608 has also been formed, according to a number of known methods, adjacent to dielectric structure 616l and on top of dielectric 612. Gate conductor 608 may be similarly formed adjacent to dielectric structure 616r. According to various embodiments, first gate conductor 610 may be used to make a memory gate and second gate conductor 608 to make a select gate of a split-gate memory cell. Disposed between the first and second gate conductors, dielectric structure 616l thus forms a multi-layer inter-gate dielectric structure.

Figure 6E:
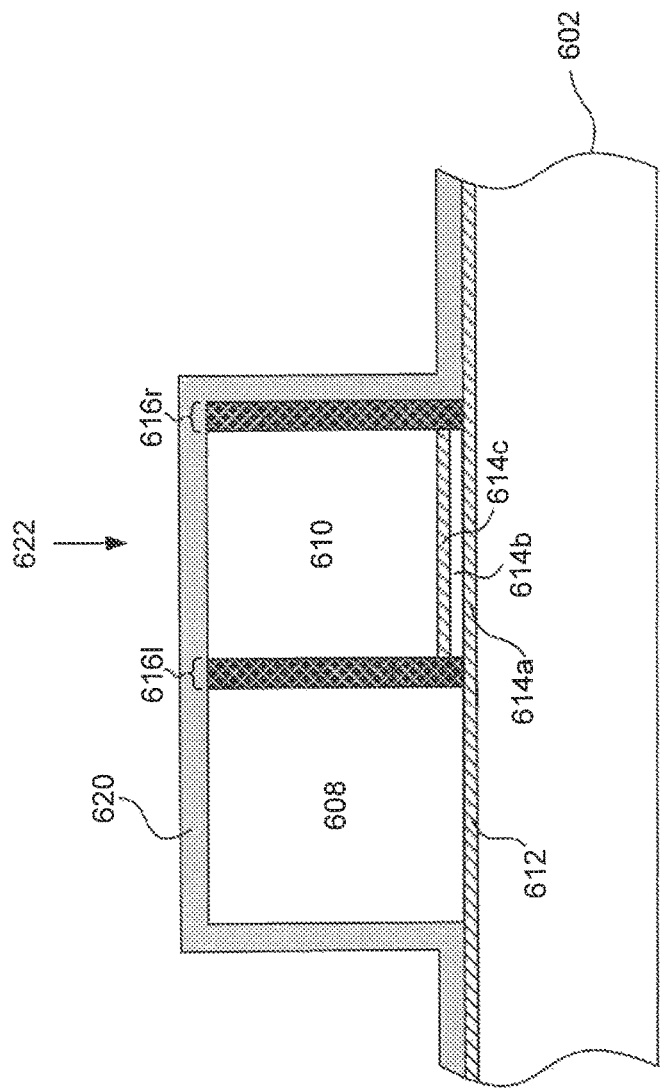

FIG. 6E depicts device 600 at an even further point in the production process, where a dielectric layer 620 is formed over substrate 602, gate conductors 608 and 610, and dielectric structures 616l and 616r. Dielectric layer 620 may be of lower quality than the dielectric films of dielectric structures 616l and 616r. As can be seen in FIG. 6E, the multi-layer inter-gate dielectric structure remains resistant to wet etch or wet clean stages prior to dielectric layer 620 being formed. Once again, this is attributed to the dielectric films of inter-gate dielectric structure having a minimal thickness or width W1-W4 in an approximate range of 30 Å or less, such that their wet etch rates are significantly less than their bulk etch rates, and the adjacent dielectric films having significantly different wet etch rates against one or more particular etchant. As a result, the multi-layer inter-gate dielectric structure can provide strong electrical isolation and high dielectric breakdown voltage between the two gate conductors.

It is to be appreciated that the Detailed Description section, and not the Summary and Abstract sections, is intended to be used to interpret the claims. The Summary and Abstract sections may set forth one or more but not all exemplary embodiments of the present subject matter as contemplated by the inventor(s), and thus, are not intended to limit the present embodiments and the appended claims in any way.

Embodiments of the present subject matter have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

Thus, embodiments of memory cells including embedded or integrally formed SONOS based NVM transistor and MOS transistors and methods of fabricating the same have been described. Although the present disclosure has been described with reference to specific exemplary embodiments, it will be evident that various modifications and changes may be made to these embodiments without departing from the broader spirit and scope of the disclosure. Accordingly, the specification and drawings are to be regarded in an illustrative rather than a restrictive sense.

The Abstract of the Disclosure is provided to comply with 37 C.F.R. § 1.72 (b), requiring an abstract that will allow the reader to quickly ascertain the nature of one or more embodiments of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

Reference in the description to one embodiment or an embodiment means that a particular feature, structure, or characteristic described in connection with the embodiment is included in at least one embodiment of the circuit or method. The appearances of the phrase one embodiment in various places in the specification do not necessarily all refer to the same embodiment.

In the foregoing specification, the subject matter has been described with reference to specific exemplary embodiments thereof. It will, however, be evident that various modifications and changes may be made thereto without departing from the broader spirit and scope of the subject matter as set forth in the appended claims. The specification and drawings are, accordingly, to be regarded in an illustrative sense rather than a restrictive sense.

What is claimed is:

1. The method of fabricating a semiconductor device, comprising:
    forming, on a substrate, a first gate stack having a first gate conductor layer and a first gate dielectric structure between the first gate conductor layer and the substrate;
    forming an inter-gate dielectric structure at a sidewall of the first gate conductor;
    forming, adjacent to the inter-gate dielectric structure, a second gate stack having a second gate conductor layer and a second gate dielectric structure between the second gate conductor layer and the substrate; and
    performing a wet etch to clean the first and second gate stacks prior to forming a dielectric layer to encapsulate at least the first and second gate stacks, and the inter-gate,
    wherein the inter-gate dielectric structure includes four or more layers of two or more different dielectric films disposed in an alternating manner, and having significantly different wet etch rates against a same etchant, wherein each of the four or more layers includes a width in an approximate range of 30 Å or less, and wherein the inter-gate dielectric structure is substantially un-etched by the wet etch in a direction perpendicular to the substrate.

2. The method of claim 1, wherein forming the inter-gate dielectric structure comprises: forming the four or more layers of dielectric films over the first gate stack and the substrate; and selectively removing a portion of the four or more layers of dielectric films.

3. The method of claim 1, further comprising forming one or more of the dielectric films of the inter-gate dielectric structure thin enough such that its wet etch rate is significantly less than its bulk etch rate.

4. The method of claim 1, further comprising forming the four or more layers of dielectric films of the inter-gate dielectric structure using in-situ film deposition.

5. The method of claim 1, further comprising forming the inter-gate dielectric structure with four alternating oxide and nitride films.

6. The method of claim 5, further comprising forming at least one further layer of oxide film including a width of 30 Å or less.

7. The method of claim 5, further comprising forming at least one further alternating pair of oxide/nitride films.

8. The method of claim 1, wherein the inter-gate dielectric structure includes a total thickness in an approximate range of 100 Å to 200 Å.

9. The method of claim 8, further comprising forming at least one further layer of nitride film including a width of 30 Å or less.

10. The method of claim 8, further comprising forming at least one further alternating pair of nitride/oxide films.

11. The method of claim 1, further comprising forming the first gate conductor layer as a memory gate of a split-gate memory cell.

12. The method of claim 1, further comprising forming the second gate conductor layer as a select gate of a split-gate memory cell.

* * * * *